United States Patent
Tischler

[11] Patent Number: 5,980,265
[45] Date of Patent: *Nov. 9, 1999

[54] LOW RESISTANCE, STABLE OHMIC CONTACTS TO SILICON CARBIDE, AND METHOD OF MAKING THE SAME

[75] Inventor: Michael A. Tischler, Danbury, Conn.

[73] Assignee: Advanced Technology Materials, Inc., Danbury, Conn.

[*] Notice: This patent is subject to a terminal disclaimer.

[21] Appl. No.: 08/447,631

[22] Filed: May 23, 1995

Related U.S. Application Data

[62] Division of application No. 08/253,969, Jun. 3, 1994, Pat. No. 5,442,200.

[51] Int. Cl.$^6$ .................................................. H01L 21/40
[52] U.S. Cl. .......................... 437/185; 437/200; 437/100; 148/DIG. 148
[58] Field of Search ..................................... 437/185, 100, 437/200; 148/DIG. 148; 438/660, 655, 931

[56] References Cited

U.S. PATENT DOCUMENTS

| | | | |
|---|---|---|---|
| 5,272,096 | 12/1993 | de Frésart et al. | 437/31 |
| 5,272,107 | 12/1993 | Suzuki et al. | 437/100 |
| 5,409,859 | 4/1995 | Glass et al. | 437/187 |
| 5,442,200 | 8/1995 | Tischler | 257/77 |

FOREIGN PATENT DOCUMENTS

| | | |
|---|---|---|
| 58-115818 | 7/1983 | Japan . |
| 59-214224 | 12/1984 | Japan . |
| 9406153 | 3/1994 | WIPO . |

OTHER PUBLICATIONS

"Electrical Contacts to Beta Silicon Carbide Thin Films," J. A. Edmond et al., J. Electrochem. Soc. 135, 359–62 (1988).

"Ohmic contacts on β–SiC," M. I. Chaudry et al. Mater. Res. Soc. Symp. Proc. vol. 162, 507–12 (1990).

"Ohmic and Schottky Contacts to N–Type Alpha (6H) Silicon Carbide," R. F. Davis et al., NTIS Order No. AD–A267966.

"Chemistry, Microstructure, and Electrical Properties at Interfaces Between Thin Films of Cobalt and α(6H)SiC(0001)," NTIS Order No. AD–A 281060.

"Ultra–Shallow Junction Formation Using Diffusion From Silicides," H. Jiang et al., J. Electrochem. Soc. 139, 196–218 (1992).

Schottky Barrier Heights of Metal Contacts To p–Type Alpha J. R. Waldrop, J. Appl. Phys. 75, 4548–50 (1994).

"Improved Silicide Ohmic Contacts to Silicon Carbide," Presented at 'High Temperature Electronics Conference', Charlotte NC Jun. 5–10, 1994.

(List continued on next page.)

*Primary Examiner*—Caridad Everhart
*Attorney, Agent, or Firm*—Janet R. Elliott; Steven J. Hultquist

[57] ABSTRACT

Stable, high temperature electrical contacts to silicon carbide formed using a unique silicide formation process that employs a sacrificial silicon layer between the silicon carbide and the contacting metal, which forms a metal silicide interlayer providing the resulting contact with low specific contact resistance and high electrical and structural stability. The contact interface is formed by reaction below the semiconductor surface, and thus the in-situ silicide formation process is insensitive to surface impurities and oxides and permits the controlled formation of silicides without the formation of excess carbon and carbides at the contact interface. The silicon layer may optionally be doped in situ during growth or implanted with dopants after growth, to lower the contact resistance and enhance its operational stability.

14 Claims, 4 Drawing Sheets

OTHER PUBLICATIONS

"Ohmic contacts for GaAs Devices," R. H. Cox, H. Strack, Solid State Electronics 10, 1213–8 (1967).

"Electrical Contacts on Silicon Carbide Thin Films," From Final Report for Contract N00014–82–K–0182, Jan. 1, 1988–Dec. 31, 1989, Order No. AD–A 219 253 (NTIS).

CRC Handbook of Chemistry and Physics, 62nd Edition, "Periodic Table of the Elements".

"Investigation of Thin–Film Ni/Single Crystal SiC Interface Reaction" J. Appl. Phys. 62, 3247–50 (1987).

"Interface Formation and Thermal Stability of Sn Overlayers Grown on Cubic SiC(100)," D. Niles et al., J. Appl. Phys 65, 662–7 (1989).

"Solid state reaction of iron on $\beta$–SiC," R. Kaplan et al., J. Appl. Phys 58, 321–4 (1985).

"Solid state reaction of Mo on cubic and hexagonal SiC," S. Hara et al., Japan. J. Appl. Phys. 29, L394–L397 (1990).

"Solid state reactions of SiC with Co, Ni, and Pt," T. Chou et al., J. Mater. Res. 6, 796–809 (1991).

"Solid State Reaction of Titanium and (0001) $\alpha$–SiC," M. B. Chamberlain, Thin Solid Films 72, 305–11 (1980).

"Anomalous Solid State Reaction Retween SiC and Pt," T. C. Chou J. Mater. Res. 5, 601–608 (1990).

"Investigation of the Structure and Stability of the Pt/SiC (001) Interface," V. Bermudez, R. Kaplan, J. Mater. Res. 5, 2882–93 (1990).

LOW RESISTANCE, STABLE OHMIC CONTACTS TO SILICON CARBIDE, AND METHOD OF MAKING THE SAME

This is a division of U.S. application Ser. No. 08/253,969 filed on Jun. 3, 1994, now U.S. Pat. No. 5,442,200.

GOVERNMENT RIGHTS IN INVENTION

This invention was made with Government support under Contract No. F33615-93-C-2331 awarded by the U.S. Air Force. The Government has certain rights in this invention.

BACKGROUND OF THE INVENTION

1. Field of the Invention

This invention relates to electrical contact structures formed between silicon carbide and silicide-forming metals, having low specific resistances and ohmic behavior and long-term electrical and structural stability, and methods for making the same.

2. Description of the Related Art

An extensive technology of semiconductor devices has been developed based upon the properties of single crystal silicon and other similar materials which may be doped, heat treated, and otherwise processed to produce adjacent layers and regions of varying electronic characteristics. The use of devices produced by silicon technology is generally limited to operation at ambient or, at most, moderately elevated temperatures and in non-corrosive, inert atmospheres. The temperature limitation is a consequence of the small band gap of silicon (1.1. eV), which leads to large leakage currents and device failure at elevated temperatures. In addition, rapid diffusion of dopants and/or impurity species can occur in silicon, which in turn can substantially alter the character of the fabricated semiconductor device. The limitation to relatively inert environments results from the high chemical reactivity of silicon in many corrosive environments, which also can alter the character of the fabricated device. Silicon devices are also limited as to power level, frequency, and radiation tolerance by the materials used therein.

For some applications, the temperature, environmental, and other use limitations on silicon microelectronic devices may be overcome by the use of proper cooling and packaging techniques. In other applications, these limitations have prevented the use of silicon for integrated circuit technology. For example, in many spacecraft and aircraft applications, elevated temperatures are encountered, and it is not always possible to insure that adequate cooling will be provided. In high power applications, device temperatures can rise to levels which degrade or destroy the device solely through internal heating. Silicon's inability to withstand high temperatures limits the amount of power which can be generated or controlled by silicon electronics. In addition, internal thermal transients in devices otherwise operating at ambient temperature can rapidly destroy the operability of the device unless extensive cooling is provided. Such cooling requires that the device be larger in size than might otherwise be necessary, in part defeating the purpose of the integrated circuit technology.

There has therefore been an ongoing, but as yet not fully successful, search over a period of twenty years to identify and develop a semiconductor technology based in other materials. Such a technology would desirably allow the fabrication of devices for use at higher temperatures such as, for example, the range of at least about 400° C. to 600° C., and in applications not amenable to the use of silicon. Because corrosive effects can be greatly accelerated at elevated temperatures and pressures, any such materials and devices must also exhibit excellent corrosion resistance at the elevated use temperatures and over a range of pressures from vacuum to many atmospheres. Some generally desirable characteristics of such materials have been identified, including large band gap, good electrical conductivity, high electric field breakdown strength, low dielectric constant, ability to be doped to produce regions of varying electronic characteristics, a high melting temperature, good strength at operating temperatures, resistance to diffusion by undesired foreign atoms, good thermal conductivity, thermal stability, chemical inertness, and the ability to form stable ohmic and rectifying external contacts.

Silicon carbide has been identified as a candidate material meeting the indicated requirements. Silicon carbide has a high decomposition temperature, good strength, good resistance to radiation damage, and good corrosion resistance in many environments. Silicon carbide has a high breakdown field strength, ten times that of silicon, a relatively large band gap, low dielectric constant, and a thermal conductivity of more than three times that of silicon at ambient temperature. The diffusion coefficients in silicon carbide are also much smaller than those in silicon or gallium arsenide, and so silicon carbide is resistant to the diffusion of impurity species. Silicon carbide may be processed by several techniques similar to those used in silicon device technology, and in many instances silicon carbide devices may be substituted at moderate and low temperatures for silicon devices. Silicon carbide semiconductor device technology therefore offers the opportunity for supplementing, and in some instances replacing, conventional silicon device technology.

Silicon carbide crystallizes in a cubic polytype as well as numerous hexagonal and rhombohedral polytypes. The 6H-SiC hexagonal polytype is currently the most developed for electronic device applications, but other polytypes, especially the hexagonal 4H-SiC and the cubic 3C-SiC, have also attracted attention for use in high power, high temperature devices. Properties of the 6H polytype are compared with those of silicon and gallium arsenide below. Combined, these advantages in physical and electrical properties predict high maximum acceptable junction temperatures and will allow extremely high power and high temperature operation.

| Property | Si | GaAs | 6H-SiC |
|---|---|---|---|
| Eg (eV) 300K | 1.11 | 1.43 | 2.93 |
| Electron mobility (R.T. $cm^2$/V-s) | 1400 | 8500 | 400 |
| Hole mobility (R.T. $cm^2$/V-s) | 600 | 400 | 40 |
| Breakdown V ($E_b$, $10^6$ V/cm) | 0.3 | 0.4 | 4.0 |
| Thermal conductivity (W/cm-°C.) | 1.5 | 0.5 | 5.0 |
| Saturated electron drift velocity ($10^7$ cm/s) | 1.0 | 2.0 | 2.0 |
| Dielectric constant | 11.8 | 12.8 | 10.0 |
| Maximum junction temp (°C.) | ≈200 | ≈300 | ≈1000 |

Silicon carbide in single crystalline form may be prepared by sublimation growth. Silicon carbide epitaxial layers may be formed or deposited by many techniques, including reactive evaporation and chemical vapor deposition (CVD). CVD is a particularly desirable fabrication approach, as it permits the controlled growth of undoped and doped layers and structures of a variety of forms. The layers may be doped in situ by inclusion of dopant species in the source gases of the CVD process, or after growth by implantation. Thus many of the processes for silicon carbide device fabrication are well-known.

Ohmic contacts, important elements of any device, are critical to the performance and stability of high power and high temperature devices. Wide band gap materials, including silicon carbide (SiC), diamond, and the III-V nitrides, currently suffer from a dearth of suitable contact strategies. Contact strategies to date have been fairly conventional, involving implantation, metallization, and deposition of simple silicides directly onto the silicon carbide surface. Although silicon carbide devices have been operated at temperatures as high as 650° C. (J. W. Palmour, H. S. Kong and R. F. Davis, Appl. Phys. Lett. 51 (2028 (1987), the contacts have not demonstrated contact resistances comparably low to those achieved in gallium arsenide or silicon, or long term stability.

In addition to the semiconductor material, the entire microelectronic device and package (including metallization) must be suitable for high temperature operation. Stability of the contact is extremely important. Typical projected junction operating temperatures for these devices are as high as 1000° C. High temperature operation exacerbates diffusion; contacts must be designed to remain stable, both structurally and electrically, over the expected life of the device.

In addition to being stable, the contact resistance must be very low. While low contact resistances are desirable in all devices, they are a necessity in high power devices. A high contact resistance will increase the forward voltage drop and thus severely decrease device efficiency. Specific examples of high temperature devices that would desirably be fabricated in silicon carbide include power MOSFETs, thyristors, rectifiers and high frequency devices such as IMPATTs. Today, typical specific contact resistances to SiC are in the range of mid $10^{-5}$ to $10^{-4}$ $\Omega$-cm$^2$. Tomorrow, specific contact resistances need to be in the $10^{-6}$ $\Omega$-cm$^2$ range, similar to those attained in GaAs-based materials. Without low resistance contacts, the GaAs devices would not work; an analogous fate will befall SiC devices if low specific contact resistance strategies are not deployed.

A number of metals have been investigated for ohmic contacts to SiC. Typical ohmic contacts to SiC are nickel for n-type contacts and aluminum for p-type contacts. Waldrop and Grant (Appl. Phys. Lett. 56 (1990) 557) have examined additional metals in the as-deposited state; Pd, Au, Co, Ti, Ag and Tb. From the I-V characteristics, Pd, Au and Co are rectifying whereas Ti, Ag, Tb and Al are "ohmic-like" (essentially linear I-V curve in forward and reverse bias). However, as-deposited metals are not suitable for high temperature contacts—they must be annealed at a temperature higher than their intended operating temperature. During annealing, these metals chemically react with the SiC to produce metal carbides and/or metal silicides, which are stable at the device operating temperatures.

Direct silicide formation on SiC is complicated by the fact that SiC, in addition to silicon, also contains carbon. After annealing, complicated metallurgy at the interface results. For example, annealing Ti on SiC at temperatures between 570–800° C. resulted in diffusion of C and Si into the titanium and the formation of TiC and excess silicon (M. B. Chamberlain, Thin Solid Films 72 (1980) 305). No titanium silicides were observed. While TiC is a potential contact, the silicide would be preferred because of its lower sheet resistance. In addition, carbide formation continued for at least 20 hrs at 606° C.; clearly not acceptable metallurgy for a stable high temperature contact. Other examples include Mo and Pt on SiC. In the case of Mo, a Mo$_2$C/Mo$_5$Si$_3$/SiC multilayer was observed after annealing (S. Hara et al., Jap. J. Appl. Phys. 29 (1990) L394). Annealing Pt on SiC resulted in a periodic structure consisting of alternating layers of platinum silicides and carbon (T. C. Chou, J. Mater. Res., 5 (1990) 601).

We have demonstrated Ti-based contacts to SiC with specific contact resistances as low as $10^{-4}$ $\Omega$-cm$^2$, as well as co-evaporated TiSi contacts which showed resistances as low as $\sim 5 \times 10^{-3}$ $\Omega$-cm$^2$. These results indicate that co-evaporation is not ideal for deposition of TiSi to produce low resistance contacts. From Chamberlain's results discussed above, it is likely that the actual contact in the Ti case was TiC. More recent results indicate that Ti$_5$Si$_3$, as well as TiC, form at the interface between silicon carbide and titanium (L. B. Rowland et al., ONR Workshop on SiC Materials and Devices, Sep. 10–11, 1992, Charlottesville, Va. pp. 8). This work used epitaxially deposited Ti, followed by 700° C. annealing in vacuum.

Tungsten and tungsten-gold alloys, after annealing at temperatures between 800–1600° C., had contact resistances between $7 \times 10^{-4}$ and $7 \times 10^{-5}$ $\Omega$-cm$^2$, depending on the SiC carrier concentration (M. Anikin et al., Ioffe Physico-Technical Institute, Academy of Sciences of the USSR, Leningrad). Sputtered and alloyed TaSi$_2$ has been used in devices operating up to 650° C., although no contact resistances or stability data have been reported (J. W. Palmour, H. S. Kong and R. F. Davis, J. Appl. Phys. 64 (1988) 2168). Nickel has also been used in high temperature devices, but again no data specific to the contacts has been reported (R. F. Davis et al., Proc. IEEE. 79 (1991) 677). It is likely that in this case Ni$_2$Si was formed, as was reported when nickel was annealed at 600° C. on SiC (I. Ohdomari, et al., J. Appl. Phys. 62 (1987) 3747). No carbides were detected, but carbon was distributed uniformly throughout the reacted film. Investigations of platinum silicide indicate that it forms a Schottky contact to SiC (N. A. Papanicolaou et al., J. Appl. Phys. 65 (1989) 3526).

Therefore there is a need for a technology capable of forming stable, low specific resistance contacts to silicon carbide in all of its useful polytypes. Key to making such stable contacts is to understand and control the metallurgy and band structure at the contact interface. In an ohmic contact, the current flow is proportional to the applied voltage, both in sign and magnitude. For a low resistance contact, large currents should be supported without a significant voltage drop across the contact region. Tunneling processes exhibit linearity over a larger range than thermionic or thermionic field emission and thus it is desired that current conduction be dominated by tunneling in a low resistance contact. A large conductance (or small specific contact resistance) is achieved with a heavily doped semiconductor and a small potential energy barrier height. Heavy doping decreases the barrier width, resulting in increased current flow and a lower potential drop across the contact. The depletion region under the contact for heavily doped material is very small, on the order of 100 Å for a carrier concentration of $10^{19}$ cm$^{-3}$. This means that the heavily doped contact region can be extremely thin. A small barrier height at the contact interfaces facilitates current flow with little resistive loss. The barrier height in the ideal case is determined by the work function of the metal and the electron affinity of the semiconductor. However, because of interface states, the actual barrier height often does not agree with this value.

J. M. Andrews and J. C. Phillips (Phys. Rev. Lett. 35 (1975) 56) correlated the barrier height of a number of silicide-silicon interfaces with the heats of formation of the silicides. Their work clearly showed that those metals which are more reactive with silicon, i.e. form silicides with higher heats of formation, made better ohmic contacts (lower barrier heights). From these results, silicides of Ni, Co, W, Ta, Ti, Cr, Mo and Zr have been identified as good candidate metals for formation of ohmic contacts to SiC.

One problem observed with all of these contacts is that many phases of metal silicides and carbides are possible. This is because both silicon and carbon are present in SiC. The case is much simpler for contacts to an elemental semiconductor such as silicon or germanium since only one element is available for reaction with the metal.

Accordingly, it is an object of the present invention to provide stable, low resistance ohmic contacts to silicon carbide for use in high temperature, high power devices by controlling the metallurgy of the contact interface through the use of a sacrificial interlayer structure. This interlayer presents only one element to the metal, which greatly simplifies the contact metallurgy. A further object of the invention is to provide methods for fabricating these contact structures.

Other objects and advantages of the present invention will be more fully apparent from the ensuing disclosure and appended claims.

SUMMARY

In one aspect, the present invention relates to stable, high temperature electrical contacts to silicon carbide formed using a unique silicide formation process that employs a sacrificial silicon layer between the silicon carbide and an appropriate contacting metal. The silicon layer reacts with the contacting metal to form a metal silicide interlayer providing the resulting contact with low specific contact resistance and high electrical and structural stability. This "sacrificial" silicon layer permits the controlled formation of silicides without the formation of excess carbon and carbides at the contact interface. These "non-carbonaceous" metal silicide contacts contain less than 5% and preferably less than 1% of carbonaceous species, including free elemental carbon, carbides, or other carbon-containing compounds. Elimination of extraneous species which can diffuse and degrade the contact enhances the long term stability of the contact. The contact interface is formed by reaction below the semiconductor surface, and thus the in-situ silicide formation process is insensitive to surface impurities and oxides.

In another aspect, the invention pertains to stable, high temperature electrical contacts to silicon carbide formed using a silicide formation process that employs a heavily doped sacrificial silicon layer between the silicon carbide and the contacting metal. The doped silicide interlayer provides a diffusion source to heavily dope the semiconductor-silicide interface to further lower contact resistance.

In yet another aspect, the invention pertains to a method of forming stable, high temperature electrical contacts to silicon carbide, wherein a sacrificial layer of silicon is deposited on the silicon carbide surface followed by an overlayer of the contacting metal. Upon annealing at temperatures of 800–1100° C., stable low resistance ohmic contacts are formed. The silicon layer may optionally be doped in situ during growth or doped after growth by implantation, in-diffusion of a deposited layer of dopant species, or other suitable means.

In yet another aspect, the present invention pertains to a method for fabricating self-aligned stable, high temperature electrical contacts to silicon carbide, wherein a sacrificial layer of silicon is deposited on the silicon carbide surface, and a dielectric film (i.e. SiO$_2$) is deposited and patterned followed by deposition of an appropriate contact metal. Upon annealing, a silicide forms only where the contact metal touches the silicon layer. The remaining metal on the SiO$_2$ pattern is then etched off, leaving intact the self-aligned suicide contact, which is much more resistant to the etchant. The silicon layer may optionally be doped in situ during growth or doped after growth.

Other aspects and features of the invention will be more fully apparent from the ensuing disclosure and appended claims.

DETAILED DESCRIPTION OF THE INVENTION, AND PREFERRED EMBODIMENTS THEREOF

Figure 1A:
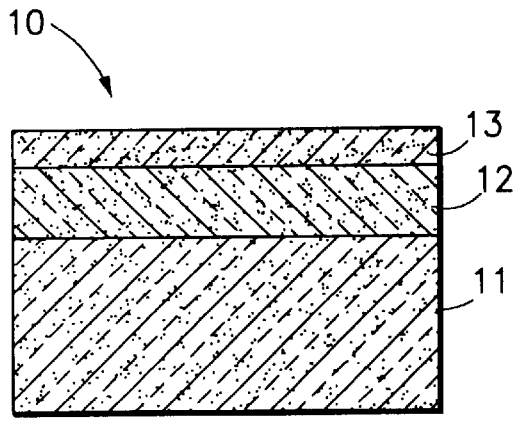
FIG. 1 shows a schematic of the process for fabricating contacts to SiC, wherein a thin silicon layer in grown or deposited on top of the SiC (A), followed by metal deposition (B), and annealing to form the metal silicide (C). Optionally, if the silicon layer is heavily doped, a heavily doped interface region results (D).
Figure 1B:
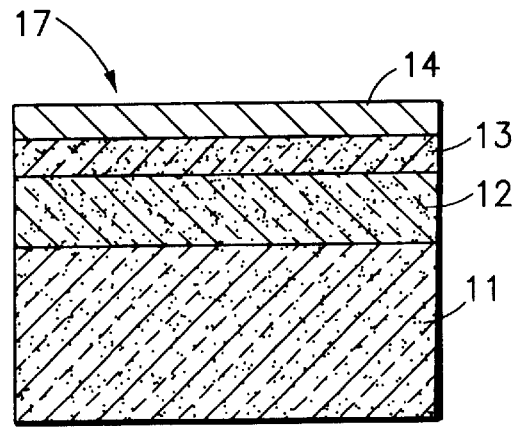
Figure 1C:
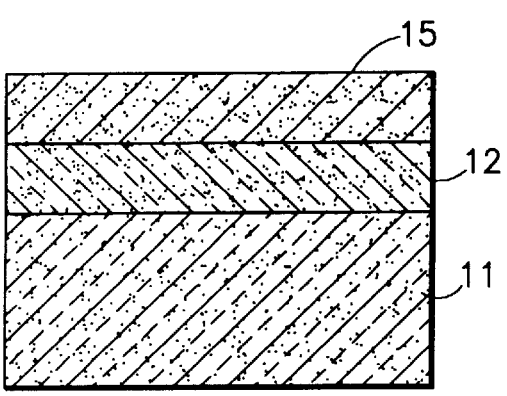

The present invention relates to stable, high temperature electrical contacts to silicon carbide formed using a unique silicide formation process that employs a sacrificial silicon layer between the silicon carbide semiconductor substrate and the contacting metal, wherein the silicon layer reacts with the contacting metal to form a metal silicide. The sacrificial silicon layer may optionally be heavily doped, in order to provide a diffusion source which will, during annealing, diffuse dopant into the immediate contact region and so provide a lower potential energy barrier between the semiconductor and the metal silicide contact. The silicide contact ensures operational stability at high temperatures. In the practice of the present invention, "heavily doped" refers to material that is doped to levels of $\geq 10^{18}$ carriers/cm$^3$, and preferably to levels $\geq 10^{19}$ carriers/cm$^3$.

The contact interface is formed by reaction below the semiconductor surface, and thus the process of reaction of the silicon layer with the contact metal to form metal silicide is relatively insensitive to surface impurities and oxides and permits the controlled formation of silicides without the formation of excess carbon and carbides at the contact interface. Elimination of extraneous species which can diffuse and degrade the contact enhances the long term structural and electrical stability of the contact. Because a metal or a metal silicide is not directly deposited upon the silicon carbide, carbides do not form upon annealing. The resulting "non-carbonaceous" metal silicide contacts contain less than 5% and preferably less than 1% of carbonaceous species, including free elemental carbon, carbides, or other carbon-containing compounds.

In addition to forming low resistance contacts, metal silicides useful in the practice of the invention should themselves have low resistivity to reduce parasitic resistances from the interconnects. The resistivities of thin films of various silicides and carbides are listed below:

| Silicide | Resistivity ($\mu\Omega$-cm) | Thickness (nm) |
|---|---|---|
| PtSi | 51 | 44 |
| $Pd_2Si$ | 30 | 64 |
| $WSi_2$ | 70 | Thin film |
| $TaSi_2$ | 50–55 | Thin film |
| TiC | 50 | Bulk |
| NiSi | 14 | 36 |
| $TiSi_2$ | 17 | 25 |
| $CoSi_2$ | 16 | 29 |

In many ways, silicides are the ideal contact compounds. They are extremely stable at high temperatures and have low resistances, and, based on the results obtained with silicon semiconductors, have the potential to form contacts with low specific contact resistances. Silicides can be formed between silicon and almost half of the elements in the Periodic Table. Transition metal silicides are of the most interest because of their low resistivities. In addition to low resistivity, the metal silicide should preferably have a high melting point to provide the electrical contact with structural stability at high temperature. A low potential energy barrier between the metal silicide and the silicon carbide substrate is important, and so metal silicides that are known to make ohmic contact with silicon or silicon carbide are good candidate materials for the contacts of the present invention.

Suitable contacting metals for the present invention must form a stable, low resistivity silicide compound as described above. Such metals include the Group 4b, 5b, 6b, 7b, and 8 transition metals of the Periodic Table (CRC Handbook of Chemistry and Physics, 62nd Ed., 1981, CRC Press, Boca Raton, Fla.) and their mixtures and alloys. In addition, the metal should form a silicide with a high melting point, greater than 1000° C. and preferably greater than 1200° C. Of these metals, Ni, Cr, Pd, Ti, W, Ta, Mo, Co, Zr, and Ti-W alloy are preferred, and Mo, Ta, Ni, Pd, and Ti-W are most preferred.

The present invention provides a contact to SiC using a metal silicide formed in situ. The advantages of this technique include (1) the silicides provide stability at high temperatures, (2) the fabrication process permits self-alignment of the contact. Furthermore, the metal silicide layer may optionally be heavily doped, whereupon it may serve as a diffusion source for diffusing dopants into the contact region. Using the silicide as a diffusion source produces a heavily doped layer at the semiconductor-silicide interface, resulting in low contact resistance. A single dopant may be used to dope both the silicide and the SiC substrate, where such dopant is an effective doping species for both silicon and silicon carbide. Otherwise, two dopants may be used, one to dope the silicide and the other to dope the SiC. For p-type doping, boron can be used to dope both the silicide contact and the SiC substrate. Aluminum may also be used to dope the silicide. For n-type doping, P, As or Sb may be preferably employed to dope the silicide while N may be preferably employed to dope the SiC; As and Sb may be employed to dope both the silicide and the SiC.

The dopant may be implanted directly into the silicide. Co-doping during silicon growth, or during metal or silicide deposition may also be employed. To summarize, the doping may be accomplished using the following approaches:

1. After the metal is deposited, the structure may be implanted with the appropriate dopant. Ultra shallow silicide contacts have been formed to silicon by implanting arsenic or boron fluoride in this fashion (H. Jiang et al., J. Electrochem. Soc., 139 (1992), 196). However, implantation may cause damage and requires extra steps.

2. The silicon layer may be co-doped during growth by including the p- or n-type dopant source (e.g., $AsH_3$, $PH_3$, $B_2H_6$, etc.) in the source gas flowing into the CVD reactor. Better control of doping profile is possible via CVD compared to implantation, less damage results to the semiconductor lattice compared to the results from high energy species being implanted.

3. After the (undoped) silicon layer is grown, a thin layer of dopant may be deposited by, for example, sputtering, evaporation, CVD etc.) followed by deposition of the metal layer. The dopant is then diffused into the contact region by annealing. This technique is well-adapted for device fabrication schemes employing sputtering or evaporation deposition processes. This process is also useful if it is desirable to avoid introducing silicon dopant species into the silicon carbide deposition reactor.

The advantages of doping the SiC-silicide interface from the silicide over conventional implantation into the interface are that (1) fewer process steps are required, (2) implantation damage in the SiC is eliminated, and (3) very shallow junctions can be formed.

The diffusion coefficients in SiC are very small, on the order of $10^{-13}$ to $10^{-16}$ $cm^2$/second at 1400° C. (*Technology of Si, Ge and SiC*, subvolume C, Landolt-Bornstein, v. 17, ed. O. Madelung, M. Schulz and H. Weiss, Springer-Verlag, Berlin (1984)). However, as noted above, the thickness of the heavily doped region is very thin, less than 100 Å. Thus annealing the silicon carbide/doped silicon/contact metal structure at temperatures near the epitaxial growth temperature of SiC (1400° C.) for about 1 hour provides enough diffusion to form the required low resistance silicide contact structure.

Figure 1D:
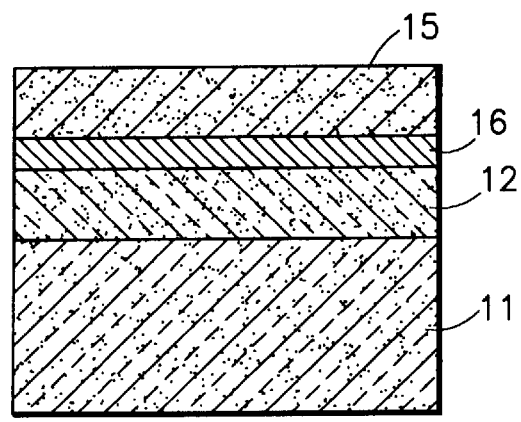
Figure 2A:
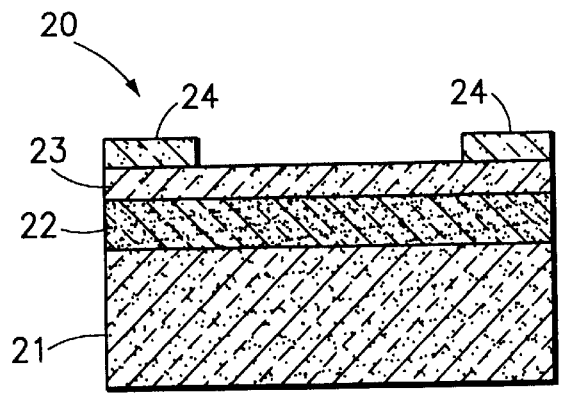
FIG. 2 shows a schematic wherein the process of the present invention can be used to make self-aligned contacts as well by first depositing and patterning a dielectric film (i.e. SiO$_2$) prior to metal deposition; upon annealing, a silicide forms only where the metal touches the silicon and the remaining metal on the SiO$_2$ pattern is then etched off, leaving intact the self-aligned silicide contact, which is much more resistant to the etchant. The remaining silicon layer may be removed if desired.
Figure 2B:
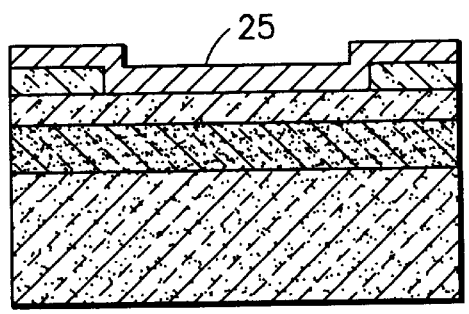
Figure 2C:
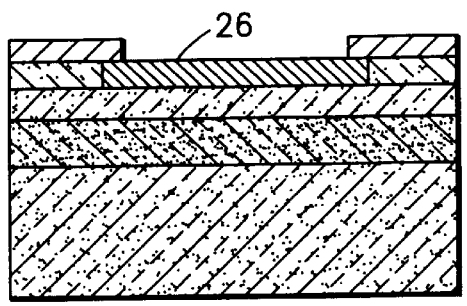
Figure 2D:
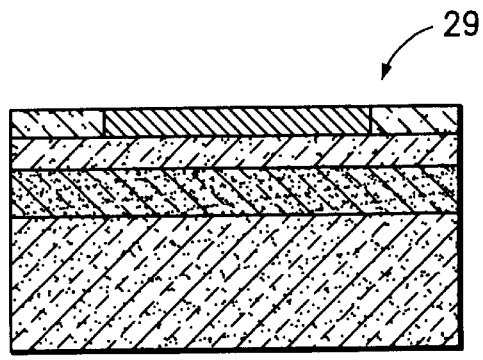

The silicides are fabricated using a novel technique to prevent the formation of excess carbon or carbides at the SiC-contact interface, thus enhancing the thermal stability of the contact by eliminating extraneous species which could diffuse and degrade the contact. A thin silicon layer, optionally heavily doped, is grown on top of the SiC, followed by metal deposition on top of the silicon layer and annealing. A schematic of the process for fabricating contacts with this technique is shown in FIG. 1. The structure 10 consists of a SiC substrate 11 on a surface of which is formed a heavily doped SiC contact layer 12 followed by a thin sacrificial silicon layer 13 (FIG. 1A). In an actual device, these layers would be the last to be grown. Silicon is easily grown by simply turning off the carbon source in a SiC CVD growth reactor; or alternatively the silicon layer may be deposited by sputtering or evaporation. The silicon layer may be doped during or after growth to achieve even lower resistances in the metal silicide contact. After growth of the device and contact layers (heavily doped SiC followed by silicon), the metal layer 14 is deposited (FIG. 1B), by sputtering, evaporation, CVD or any suitable technique. The silicide is then formed by annealing structure 17 in an inert ambient (FIG. 1C), whereupon the metal and silicon layers react in situ to form a metal silicide. These steps may optionally include introduction of a dopant, and annealing to diffuse the dopant to the SiC interface (FIG. 1D).

It should be noted that this process can be used to make self-aligned contacts as well by first depositing and patterning a dielectric film (for example, $SiO_2$, silicon nitride, silicon oxynitride) prior to metal deposition. Upon annealing, a silicide forms only where the metal touches the silicon. The remaining metal on the dielectric pattern is then etched off, leaving intact the self-aligned silicide contact, which is much more resistant to the etchant. In addition, the deposited silicon (especially if it is undoped) and dielectric act as passivants for the SiC surface.

The steps for fabrication of such self-aligned contacts are shown schematically in FIG. 2. Structure 20 in FIG. 2A comprises a SiC substrate 21 on a surface of which is formed a heavily doped SiC contact layer 22 followed by a thin sacrificial silicon layer 23, upon which a dielectric masking material 24 such as silicon dioxide, silicon nitride, silicon oxynitride, etc. is deposited and patterned, leaving openings only where the contact is to be formed. The metal layer 25 for the silicide contact is then deposited over the entire sample as shown in FIG. 2B. The sample is then annealed (FIG. 2C), and the silicide 26 is only formed where the metal is in contact with the silicon interlayer. Finally the remaining metal is removed (FIG. 2D) to leave the final self-aligned contact structure 29. The excess metal is typically removed using a wet chemical etch that preferentially etches the metal with respect to the silicide, but other removal techniques such as reactive ion etching, plasma etching, etc. are also possible. The remaining silicon (especially if it is undoped) and dielectric can be left on the sample to act as a passivation for the SiC surface or can optionally be removed, for example by using chemical etches such as HF/water etches for the silicon dioxide and HF/nitric acid etches for the silicon.

The thickness of the deposited silicon layer is selected so that the silicon is the stoichiometrically limiting material in reaction with the subsequently deposited metal to form metal silicide. In this way, excess carbon and carbide do not form, as they do when silicides are directly made on SiC. The amount of metal which should be deposited to consume a given layer of silicon during silicide formation may be calculated on the basis of stoichiometry of the silicide compound formed and atomic weight and density of the pure metal. The deposited metal thicknesses required to consume a 30 nm layer of silicon during silicide formation are listed below for titanium, cobalt, nickel, and palladium, calculated on the basis of stoichiometry of the silicide compound formed and atomic weight and density of the pure metal:

| Metal | Metal Thickness (nm) | Silicide Thickness (nm) |
|---|---|---|
| Ti | 18 | 25 |
| Co | 8.3 | 29 |
| Ni | 16 | 36 |
| Pd | 45 | 64 |

After the deposition steps, the contact structure is typically annealed. It should be noted that annealing is required to form the ohmic silicide contact. If the silicon layer is heavily doped, the annealing step also promotes out-diffusion of the dopant into the immediate contact region to dope the interlayer structure and provide a narrower potential energy barrier. The contact structures may be annealed at 800–1100° C., with 900–1050° C. preferred.

The contact structures of the present invention have been characterized based on two major parameters, specific contact resistances and reproducibility of electrical properties. The specific contact resistances to SiC were measured using the method of Cox and Strack (Solid State Electron., 10, 1213 (1967)). This technique is easy to implement and does not require insulating substrates. Reproducibility was evaluated by recording current-voltage curves for contacts of the same size fabricated at different locations on the SiC wafers.

The features and advantages of the invention are more fully illustrated by the following non-limited examples.

EXAMPLE 1

Nine samples were prepared. First, 0.5 $\mu$m of heavily doped (~$2 \times 10^{18}$ $cm^3$ nitrogen-doped) n-type 6H-SiC was epitaxially grown by low pressure CVD. The substrates were single crystal 6H-SiC. On samples 2, 3, 5, 6, 8, and 9 a second lay of silicon was grown on top of the n-type SiC epilayer in situ, without removal from the CVD reactor, by turning off the hydrocarbon source and lowering the reactor temperature to 850° C. All films had a specular appearance. The samples differed in the thicknesses of the silicon layers. Contact resistance patterns were fabricated on the samples by first forming the back contact to the SiC surface and then forming a silicide contact to the front silicon surface. The back contact consisted of a large area nickel ohmic contact that was annealed prior to deposition of the front metal. The front metal was deposited using lift-off lithography and evaporated metal. The diameters of the front contacts varied from 6 to 250 $\mu$m. Contact resistances were measured in the as-deposited state and after annealing. The annealing temperatures ranged from 900° C. to 1100° C., the annealing time was 60 minutes, and the ambient gas was forming gas ($N_2/H_2$). The metal thicknesses were chosen to form most of the silicide from the silicon and not from the silicon carbide. Specific contact resistances $R_C$ were measured by the Cox and Strack technique. The results are shown below:

| Sample | Si Thickness (Å) | Ni Thickness (Å) | Anneal (°C.) | $R_C$ (x$10^{-5}$ $\Omega$-$cm^2$) |
|---|---|---|---|---|
| 1 | 0 | 500 | 900 | 11 ± 5 |
| 2 | 300 | 250 | 900 | 18 ± 8 |
| 3 | 600 | 500 | 900 | 3 ± 1.8 |
| 4 | 0 | 500 | 1000 | 5 ± 4 |
| 5 | 300 | 250 | 1000 | 3 ± 2.6 |
| 6 | 600 | 500 | 1000 | 1.3 ± 0.5 |

-continued

| Sample | Si Thickness (Å) | Ni Thickness (Å) | Anneal (°C.) | $R_C$ (x10$^{-5}$ Ω-cm$^2$) |
|---|---|---|---|---|
| 7 | 0 | 500 | 1100 | 1.7 ± 0.5 |
| 8 | 300 | 250 | 1100 | n.o.* |
| 9 | 600 | 500 | 1100 | n.o. |

*"n.o." means a non-ohmic contact was formed.

Clearly the samples with the silicon interlayer exhibited lower specific contact resistances. Nickel contacts required annealing to become ohmic. After a 900° C. anneal in forming gas, most became ohmic and after annealing at 1000° C., all were ohmic. However, after a 1100° C. forming gas anneal, only the large area contacts (>20 μm diameter) in most samples were ohmic. These results indicate that the optimum annealing temperature for nickel contacts is near 1000° C.

Because of the limitations of the Cox and Strack method, it is important to have an additional check on the calculated $R_C$ values. The total resistance values have been measured for the same diameter contacts which have been processed together, with and without the silicon interlayer, as outlined below. Where all other parameters are the same, the contacts with the lowest total resistance will also have the lowest specific contact resistance. In virtually all cases, the samples with the lowest total resistance also have the lowest calculated $R_C$. Thus even though there may be some small errors in the determination of the absolute $R_C$ values, the silicon interlayer does produce lower resistance contacts in this one-to-one comparison.

| Total Resistance (Ω) Sample (Si thickness, (Å) | Contact Diameter (μm) | | | | | | |
|---|---|---|---|---|---|---|---|
| | 100 | 50 | 40 | 30 | 20 | 15 | 12 |
| 1 (0) | 16 | 18.9 | 21.9 | 28 | 41 | — | — |
| 2 (300) | 22 | 23.8 | 26.2 | 31.2 | — | — | — |
| 3 (600) | 8.8 | 12 | 13.4 | 15.4 | 33 | | |
| 4 (0) | 14 | 18.3 | 20.9 | 25.8 | 32.5 | 37.2 | 48 |
| 5 (300) | 13.2 | 15.6 | 20 | 22 | 30 | 36 | 41 |
| 6 (600) | 8.8 | 13 | 14.1 | 17.9 | 27.4 | 31.3 | 41.7 |

Figure 3A:
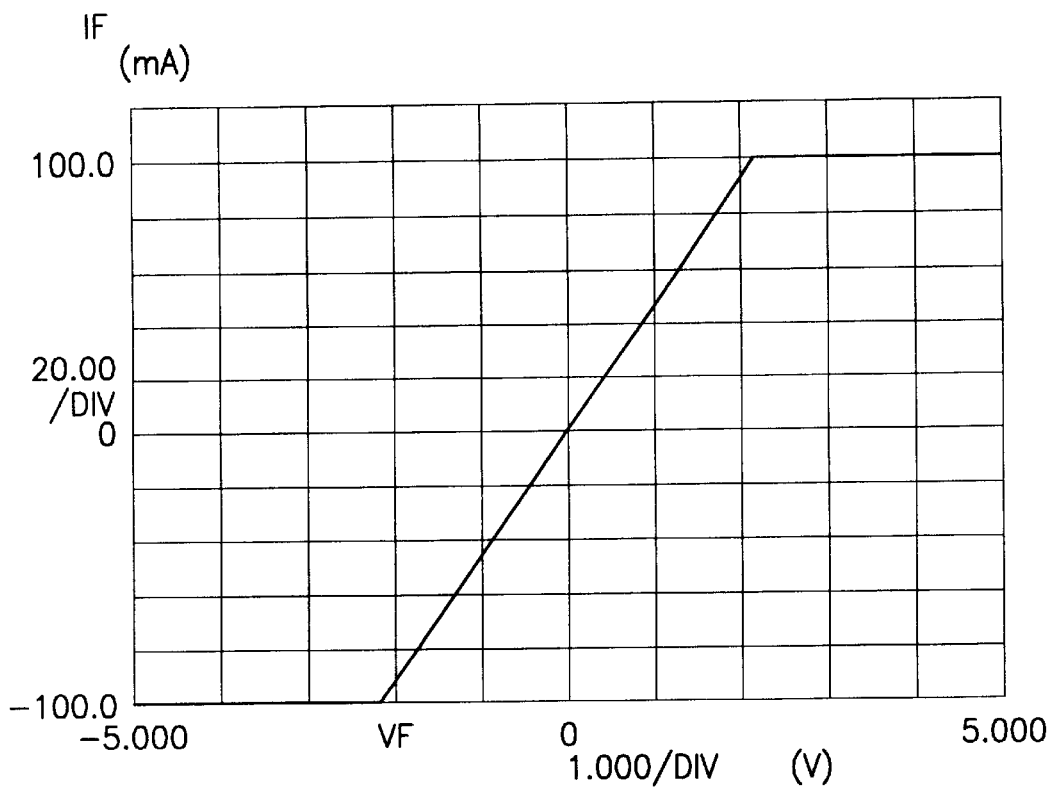
FIG. 3 shows a number of I-V scans for 250 $\mu$m diameter nickel contacts to n-doped 6H-SiC annealed for 60 minutes at 900° C., of the same size contacts on different parts of the wafer, with FIG. 3A showing scans of 15 contact structures fabricated with a 500 Å sacrificial silicon interlayer structure and 3B showing scans of 12 contact structures for a sample fabricated with no silicon interlayer.
Figure 3B:
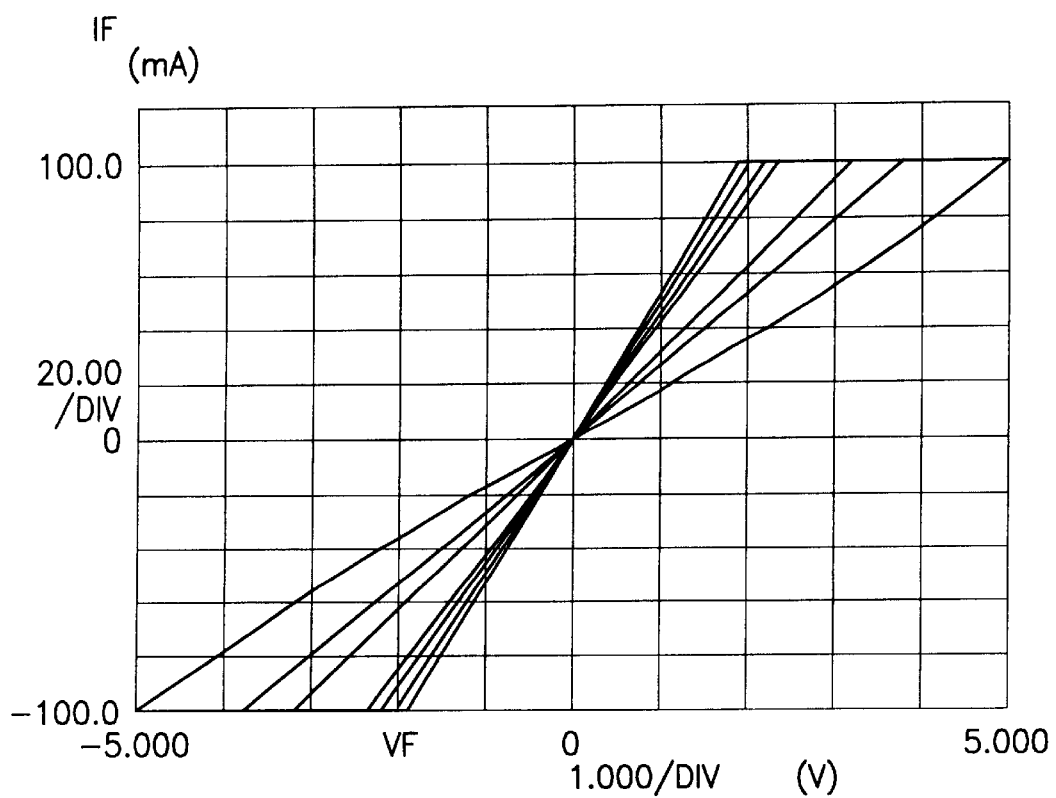

In addition to lower contact resistances, the silicon interlayer gave greatly improved reproducibility. FIG. 3 shows many I-V scans for 250 μm diameter Ni contacts annealed at 900° C. in forming gas for 60 minutes. FIG. 3A shows scans of 15 contact structures on different parts of the wafer, fabricated with a 500 Å sacrificial silicon interlayer structure, and 3B shows scans of 12 contact structures for a sample fabricated with no silicon interlayer. It is clear that the silicon interlayer greatly increases the reproducibility of the contact resistance.

EXAMPLE 2

Palladium contacts of sizes ranging from 10 μm up to 250 μm in diameter were fabricated to n-type 6H-SiC (nitrogen-doped) by the method described in Example 1, with silicon interlayer thicknesses varying from 300 Å to 600 Å and Pd thicknesses of 300 Å and 500 Å. Annealing was performed in forming gas at temperature varying from 800 to 1100° C., with the anneal at about 1000° C. to 1100° C. giving the ohmic contacts of the lowest contact resistances. Specific contact resistance of these were:

| Sample | Si Thickness (Å) | Pd Thickness (Å) | Anneal (°C.) | $R_C$ (x10$^{-5}$ Ω-cm$^2$) |
|---|---|---|---|---|
| 10 | 600 | 300 | 1050 | 2 ± 1 |
| 11 | 300 | 300 | 1100 | 3.5 ± 1 |
| 12 | 380 | 500 | 1100 | 11 ± 1 |

Figure 4A:
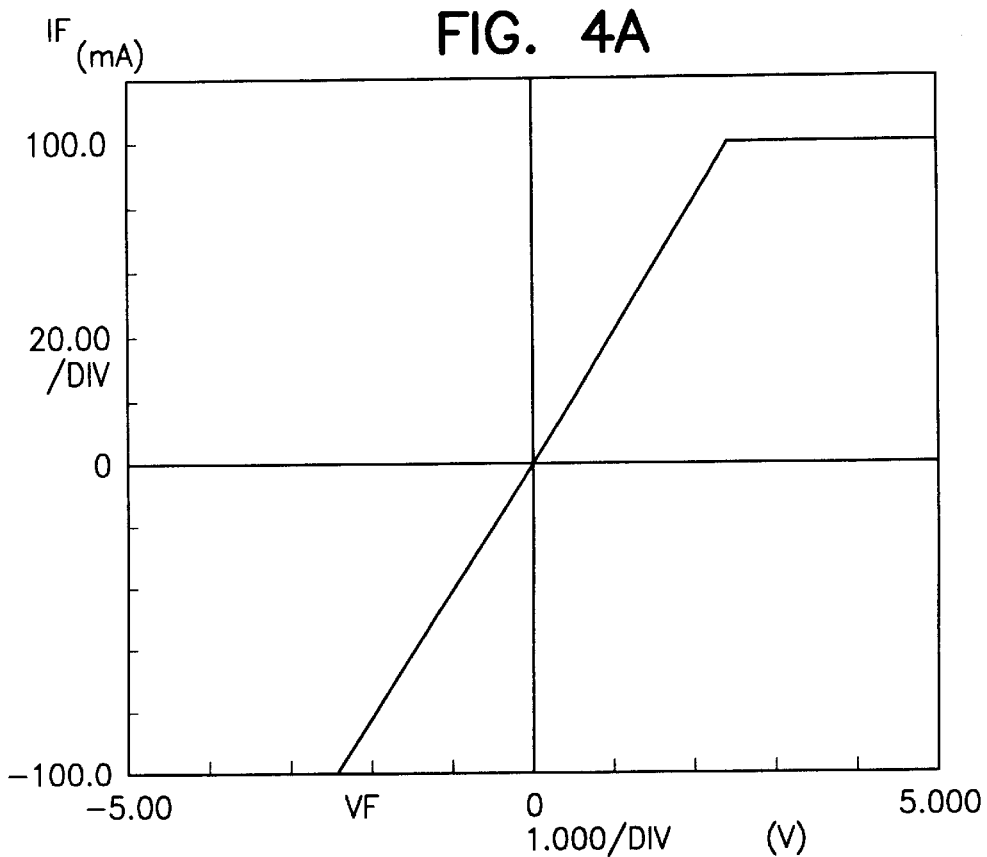
FIG. 4 shows a number of I-V scans for palladium contacts to n-doped 6H-SiC, with 4A showing scans of five contact structures on different parts of the SiC wafer fabricated employing a 300 Å Pd layer over a 600 Å silicon interlayer, 40 $\mu$m diameter contact annealed at 1050° C. for 30 minutes, and 4B showing scans of eight contact structures fabricated employing a 500 Å Pd layer over a 380 Å silicon interlayer, 100 $\mu$m diameter contact annealed at 1100° C.
Figure 4B:
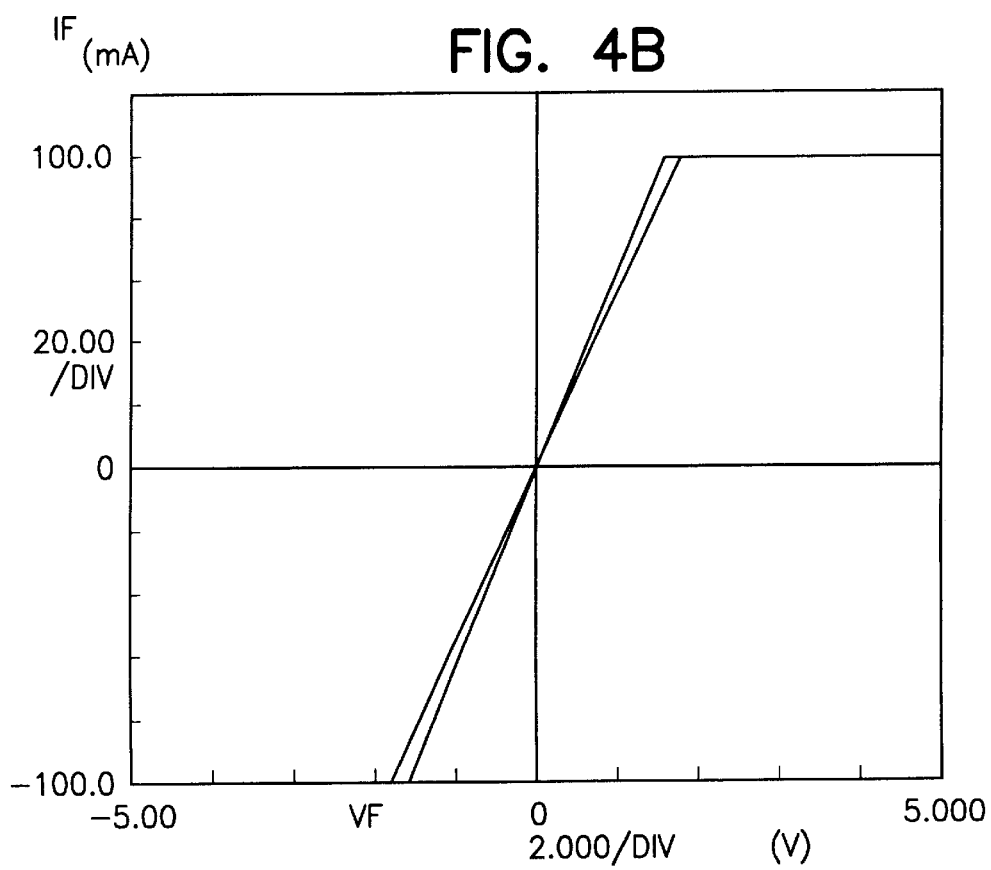

FIG. 4 shows current-voltage scans of palladium contacts on n-doped 6H-SiC, with 4A showing scans of five contact structures on different parts of the SiC wafer fabricated employing a 300 Å Pd layer over a 600 Å silicon interlayer, 40 μm diameter contact annealed at 1050° C. for 30 minutes in forming gas (5% $H_2$ in $N_2$, and 4B showing current-voltage scans of eight contact structures fabricated employing a 500 Å Pd layer over a 380 Å silicon interlayer, 100 μm diameter contact annealed at 1100° C. or 30 minutes in forming gas.

While the invention has been described herein with reference to specific aspects, features, and embodiments, it will be apparent that other variations, modifications, and embodiments are possible, and all such variations, modifications, and embodiments therefore are to be regarded as being within the spirit and scope of the invention.

What is claimed is:

1. A method of forming ohmic contacts on a SiC substrate, comprising the steps of:
    first forming a silicon layer on the SiC substrate;
    next providing a contact metal on the silicon layer; and
    then annealing the resulting article for sufficient time and at sufficient temperature to form a metal silicide contact by reaction of the silicon layer with the contact metal.

2. A method according to claim 1, wherein the reaction does not comprise the SiC substrate as a reactant.

3. A method according to claim 1, wherein said annealing is carried out at a temperature in the range of from about 800° C. to about 1100° C.

4. A method according to claim 1, wherein the silicon layer is doped with a dopant species selected from the group consisting of p-type dopant atoms and n-type dopant atoms, at a doping concentration of at least $10^{18}$ carriers/cm$^3$.

5. A method according to claim 1, wherein the SiC substrate is grown by vapor deposition of silicon and carbon source reagents, immediately prior to growth of said silicon layer on the SiC substrate.

6. A method according to claim 5, wherein the SiC substrate is grown by concurrently flowing silicon-containing source reagent and carbon-containing source reagent to a deposition locus at which said growth is carried out, and wherein flow of carbon-containing source reagent is discontinued and flow of silicon-containing source reagent is continued to provide growth of silicon on the SiC substrate.

7. A method according to claim 1, comprising forming self-aligned contacts on the SiC substrate, by depositing and patterning a dielectric material on the SiC substrate prior to deposition of contact metal, so that upon annealing, a metal silicide forms only where the deposited metal contacts the silicon layer, and etching to remove remaining metal on the patterned dielectric material to leave intact a self-aligned contact.

8. A method according to claim 1, wherein said step of forming the silicon layer on the SiC substrate comprises a forming method selected from the group consisting of chemical vapor deposition, sputtering, and evaporation from a silicon source.

9. A method according to claim 1, wherein the step of providing a contact metal on the silicon layer comprises a provision step selected from the group consisting of chemical vapor deposition, sputtering, and evaporation from a metal source.

10. A method according to claim 1 wherein the silicon layer is doped, by a doping method selected from the group consisting of ion implantation, co-deposition via chemical vapor deposition, sputtering and evaporation.

11. A method of forming ohmic contacts on a SiC substrate comprising the steps of:

first forming a silicon layer on the SiC substrate;

next providing a contact metal on the silicon layer; and then annealing the resulting article for sufficient time and at sufficient temperature to form a metal silicide contact by reaction of the silicon layer with the contact metal, wherein silicon is the stoichiometrically limiting material in reaction with the contact metal forming said metal silicide.

12. A method according to claim 1, wherein the metal silicide contact has a resistivity not exceeding 70 micro-ohms-cm.

13. A method according to claim 1, wherein the metal silicide contact has a resistivity not exceeding 30 micro-ohms-cm.

14. A method according to claim 1, wherein the metal silicide contact has a specific contact resistance to SiC of less than about $5 \times 10^{-5}$ ohm-cm$^2$.

* * * * *